(12) United States Patent
Tokitoh

(10) Patent No.: US 8,513,778 B2
(45) Date of Patent: Aug. 20, 2013

(54) SEMICONDUCTOR DEVICE

(75) Inventor: Shunichi Tokitoh, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/470,522

(22) Filed: May 22, 2009

(65) Prior Publication Data

US 2009/0315184 A1 Dec. 24, 2009

(30) Foreign Application Priority Data

May 26, 2008 (JP) .................. 2008-136999

(51) Int. Cl.
- H01L 29/40 (2006.01)
- H01L 23/544 (2006.01)
- H01L 23/48 (2006.01)
- H01L 23/52 (2006.01)

(52) U.S. Cl.
USPC ........... 257/621; 257/211; 257/620; 257/758; 257/762; 257/E23.011; 257/E23.019; 257/E23.02; 257/E23.142; 257/E23.143; 257/E23.145; 257/E23.152

(58) Field of Classification Search
USPC .......... 257/211, 620–621, 758, 762, E23.011, 257/E23.019–E23.02, E23.142–E23.143, 257/E23.145, E23.152, 48, E23.11
See application file for complete search history.

(56) References Cited

U.S. PATENT DOCUMENTS

| | | | |
|---|---|---|---|
| 6,998,712 B2 * | 2/2006 | Okada et al. | 257/758 |
| 7,256,474 B2 * | 8/2007 | Wakayama et al. | 257/620 |
| 7,288,799 B2 | 10/2007 | Saigoh et al. | |
| 7,417,304 B2 * | 8/2008 | Tsutsue | 257/620 |
| 7,482,675 B2 * | 1/2009 | Adkisson et al. | 257/620 |
| 7,825,446 B2 * | 11/2010 | Takahashi et al. | 257/295 |
| 2003/0020098 A1 * | 1/2003 | Sasaki | 257/210 |
| 2004/0188843 A1 * | 9/2004 | Wakayama et al. | 257/758 |
| 2005/0082577 A1 | 4/2005 | Usui | |
| 2005/0093169 A1 * | 5/2005 | Kajita | 257/774 |
| 2005/0098893 A1 | 5/2005 | Tsutsue et al. | |
| 2006/0076651 A1 * | 4/2006 | Tsutsue | 257/620 |
| 2006/0103025 A1 | 5/2006 | Furusawa et al. | |
| 2007/0013071 A1 * | 1/2007 | Adkisson et al. | 257/758 |
| 2008/0042292 A1 * | 2/2008 | Adkisson et al. | 257/773 |
| 2008/0277705 A1 * | 11/2008 | Takahashi et al. | 257/295 |

FOREIGN PATENT DOCUMENTS

| | | |
|---|---|---|
| JP | 2005-142553 | 6/2005 |
| JP | 2005-167198 | 6/2005 |
| JP | 2005-175204 A | 6/2005 |
| JP | 2006-140404 A | 6/2006 |
| JP | 2006-324265 A | 11/2006 |
| JP | 2007-335429 A | 12/2007 |

OTHER PUBLICATIONS

Japanese Notice of Rejection dated Apr. 23, 2013.

* cited by examiner

Primary Examiner — Cheung Lee
Assistant Examiner — Jeremy Joy
(74) Attorney, Agent, or Firm — Volentine & Whitt, PLLC

(57) ABSTRACT

Disclosed is a semiconductor device that is capable of preventing impurities such as moisture from being introduced into an active region at the time of dicing and at the time of bonding and that is capable of being easily miniaturized. The semiconductor device includes a cylindrical dummy wire having an opening for allowing a wire interconnecting a semiconductor element and an external connection terminal to pass therethrough, extending in an insulation film provided on a semiconductor layer having the semiconductor element to surround the semiconductor element, and disposed inside the external connection terminal.

7 Claims, 8 Drawing Sheets

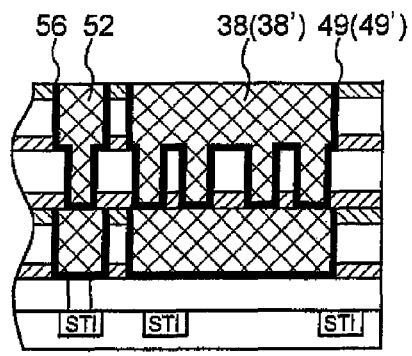
FIG. 7F
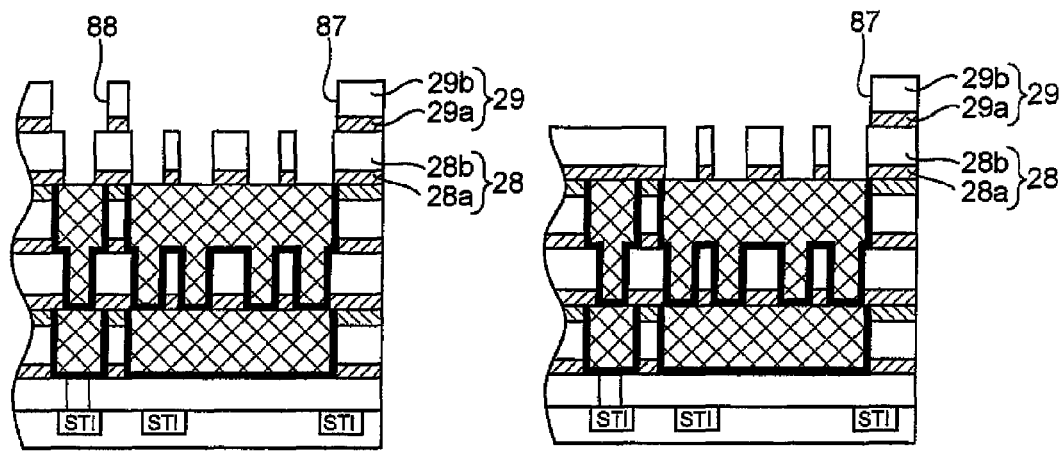
FIG. 7G1  FIG. 7G2
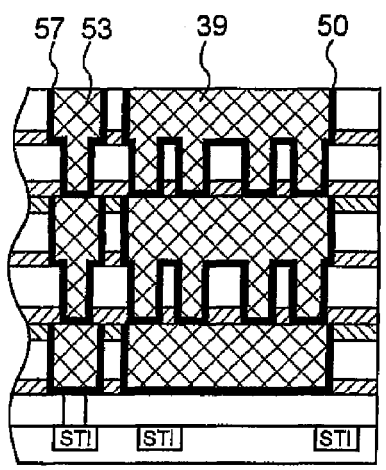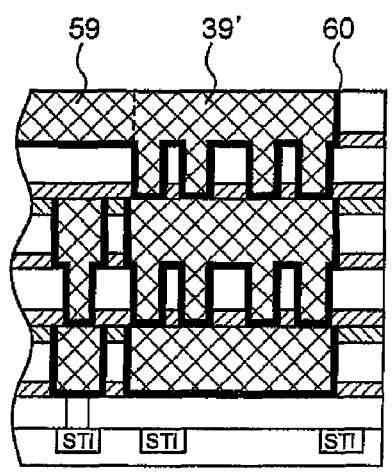
FIG. 7H1  FIG. 7H2

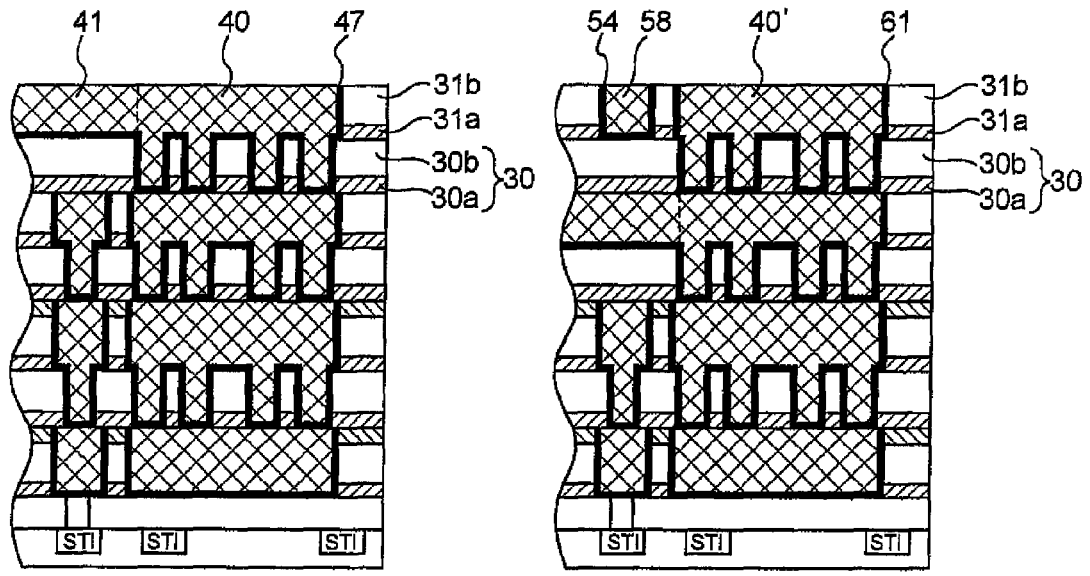
FIG. 8I1  FIG. 8I2
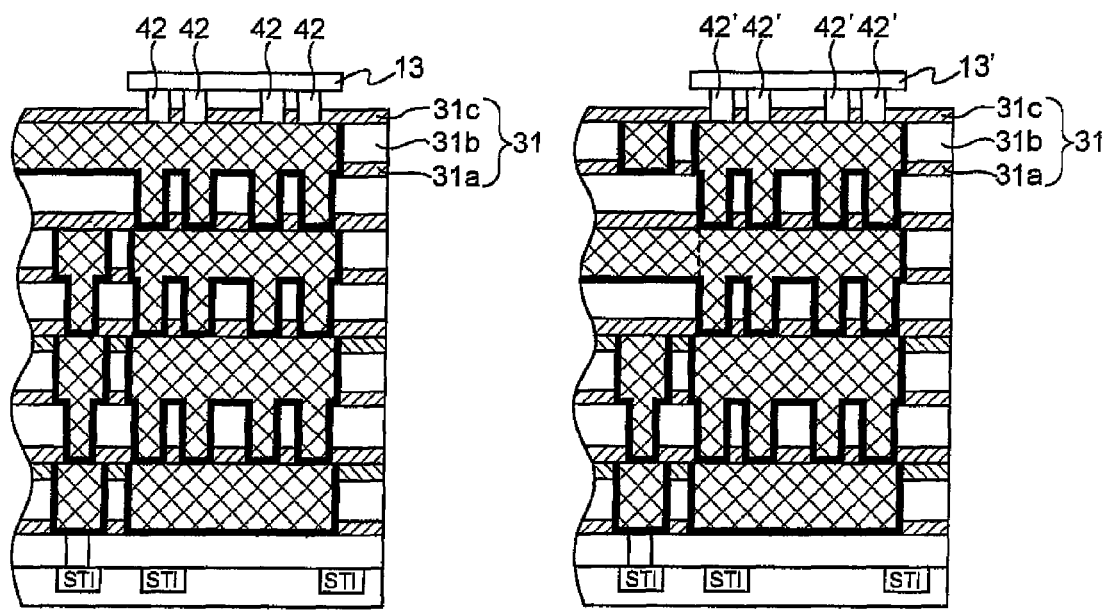
FIG. 8J1  FIG. 8J2

SEMICONDUCTOR DEVICE

BACKGROUND OF THE INVENTION

1. Technical Field

The present invention relates to a semiconductor device having a cylindrical dummy wire to surround the outer circumference of a semiconductor element.

2. Description of the Related Art

In recent years, degree of integration at the level of an element such as a transistor has been rapidly improved with the development in miniaturization of a semiconductor device such as a microprocessor and a memory. For this reason, there has been a necessity of a multi-layer wire to achieve high integration of a wire system in accordance with high integration at the level of a substrate. However, signal delay, i.e., RC delay, in the wire layer is increased due to the extension of a conventional process accompanying the miniaturization of the wire system, which hinders the increase of operation speed. Therefore, it is absolutely necessary to reduce wire resistance R and inter-wire capacity C in order to achieve further increase in speed of the microprocessor or the like. For the reduction of the wire resistance R, it is possible to greatly reduce a resistance value by changing a material for the wire from aluminum to copper. It is extremely difficult to etch copper, unlike aluminum, whereas the copper is relatively easily formed with a thickness film by a chemical vapor deposition (CVD) method as a method of forming a thin film having excellent step coverage or a plating method for filling-in. A damascene method as a process taking such merits of copper while excluding demerits of the copper is known. The damascene method is a technology for pre-forming a groove for a wire in an interlayer insulation film, depositing a copper film on the entirety of a wafer such that the groove is filled with the copper film, removing the remaining copper film excluding the portion of the copper film filling the groove using a chemical mechanical polishing (CMP) method, and forming a copper wire in the interlayer insulation film.

For the reduction of the inter-wire capacity C, on the other hand, the introduction of a so-called low-k film having a lower relative dielectric constant instead of a conventional $SiO_2$ film as a material of the interlayer insulation film is under consideration. Since poly silsesquioxane containing methyl (MSQ) attracting attention as a material of the low-k film generates a gap in a molecular structure by the presence of a methyl group, such a film is porous. This low-k film having a low film density is highly hygroscopic. In addition, the dielectric constant of the low-k film is increased due to introduction of impurities, and therefore, the reliability of the low-k film is low. Furthermore, the low-k film is easily broken due to low mechanical strength of the low-k film when stress is applied by dicing and bonding. Also, interlayer separation may occur due to low interface adhesion of the low-k film. When such breakage or interlayer separation occurs, the low-k film absorbs external moisture because the hygroscopic property of the low-k film is high, with the result that the moisture is transmitted to an active region, which is a chip region, whereby the semiconductor device becomes defective, and its yield ratio is lowered.

To solve the above-described problem at the time of dicing, Patent document 1 discloses a structure in which a so-called seal ring is provided such that a bonding pad forming region and an active region are surrounded by a metal wire. Also, to solve the above-described problem at the time of bonding, Patent document 2 discloses a structure in which a so-called seal ring is provided such that the outer circumference of a bonding pad forming region is surrounded by a metal wire.

Patent document 1: Japanese Patent Kokai No. 2005-167198
Patent document 2: Japanese Patent Kokai No. 2005-142553

SUMMARY OF THE INVENTION

In the semiconductor device having the seal ring disclosed in Patent document 1, the seal ring is provided in the vicinity of a position to surround the bonding pad forming region and the active region, i.e., a scribe line. In this structure, it is possible to prevent impurities such as moisture from being introduced into the active region at the time of dicing; however, it is not possible to prevent impurities such as moisture from being introduced into the bonding pad forming region due to breakage or interlayer separation caused in the vicinity of the bonding pad forming region at the time of bonding.

In the semiconductor device having the seal ring disclosed in Patent document 2, the seal ring is provided to surround the bonding pad forming region. In this structure, it is possible to prevent impurities such as moisture from being introduced into the bonding pad forming region due to breakage or interlayer separation caused in the vicinity of the bonding pad forming region at the time of bonding; however, it is not possible to prevent impurities such as moisture from being introduced into the active region at the time of dicing. Also, since every bonding pad is covered with a seal ring, it is necessary to increase the distance between the bonding pads, with the result that it is difficult to miniaturize the semiconductor device.

Therefore, the present invention has been made in view of the above problems, and it is an object of the present invention to provide a semiconductor device that is capable of preventing impurities such as moisture from being introduced into an active region at the time of dicing and at the time of bonding and that is capable of being easily miniaturized.

In accordance with the present invention, the above and other objects can be accomplished by the provision of a semiconductor device including a semiconductor layer having a plurality of semiconductor elements, an insulation film provided on the semiconductor layer, an external connection terminal provided on the insulation film outside a region where the plurality of semiconductor elements are formed, and a wire passing through the insulation film to interconnect the external connection terminal and the semiconductor elements, wherein the semiconductor device further includes a cylindrical dummy wire having an opening for allowing the wire to pass therethrough, extending in the insulation film to surround all the semiconductor elements, and disposed inside the external connection terminal.

Also, the insulation film may have an at least two-layer structure including a low dielectric constant film and a silicon oxide film. Furthermore, the low dielectric constant film may have a relative dielectric constant of 3 or less.

Also, a layer constituted by the low dielectric constant film may be located below a layer constituted by the silicon oxide film.

Also, the opening may be formed in a portion of the cylindrical dummy wire extending in the silicon oxide film.

Also, the cylindrical dummy wire may be formed of copper. Furthermore, the cylindrical dummy wire may have an upper-end interface below a lower-end interface of the external connection terminal.

According to the semiconductor device of the present invention, the cylindrical dummy wire, having the opening for allowing the wire interconnecting the semiconductor elements and the external connection terminal to pass therethrough, extends in the insulation layer provided on the semiconductor layer including the semiconductor elements to surround all the semiconductor elements, and disposed inside the external connection terminal. Consequently, it is possible to prevent impurities such as moisture from being introduced into the active region at the time of dicing and at the time of bonding and to easily achieve miniaturization of the semiconductor device.

DETAILED DESCRIPTION OF THE INVENTION

Now, an exemplary embodiment of the present invention will be described in detail with reference to the accompanying drawings.

Embodiment

First, the structure of a semiconductor device 10 according to an embodiment of the present invention will be described in detail with reference to FIGS. 1 to 5.

FIG. 1 is a plan view illustrating part of a wafer 100 having a semiconductor device 10 according to an embodiment of the present invention formed thereon. A scribe line 200, which is a space to be cut at the time of dicing, is disposed on the wafer 100 in the shape of a lattice. The semiconductor device 10 is cut into an individual chip by dicing along the scribe line 200. The semiconductor device 10 includes a seal ring 12, which is a cylindrical dummy wire, to surround the circumference of an active region 11 in which a semiconductor element, which is a circuit element, such as a transistor, of the semiconductor device 10 is formed. Furthermore, the semiconductor device 10 includes a plurality of bonding pads 13, serving as external connection terminals, formed at a region outside the seal ring 12 (i.e., a region between the seal ring 12 and the end face of the semiconductor device 10). That is, the seal ring 12 is located between the active region 11 and the bonding pads 13 of the semiconductor device 10, cut into a chip, and is formed in a cylindrical shape to surround the active region 11. Consequently, the seal ring 12 prevents impurities such as moisture from being introduced into the semiconductor device 10 due to breakage or interlayer separation in the vicinity of the end of the semiconductor device 10 at the time of dicing and at the time of bonding. Meanwhile, one of the bonding pads in a region surrounded by a broken line 4 will be referred to hereinafter as a bonding pad 13, and the other bonding pad will be referred to hereinafter as a bonding pad 13', for the convenience of description.

FIG. 2 is a sectional view taken along line 2-2 of FIG. 1. As shown in FIG. 2, the semiconductor device 10 includes a semiconductor layer 22 where a circuit element such as a transistor, i.e., a semiconductor element 21, is formed and a wiring layer 23 where a wire is three-dimensionally formed over a plurality of layers on the semiconductor layer 22. In the wiring layer 23 are stacked, for example, eight layers, i.e., interlayer insulation films 24 to 31. In the interlayer insulation films 24 to 31 are formed a contact plug 32, a first element wire 33 to fourth element wire 36, a first bonding wire 37 to fourth bonding wire 40, and a connection wire 41 connecting the fourth element wire 36 with the fourth bonding wire 40, which constitute multi-layer wires. Also, a bonding pad 13 is connected to the fourth bonding wire 40 via, for example, four contact plugs 42. Furthermore, a seal ring 12 is formed between the stacked first element wire 33 to fourth element wire 36 and the stacked first bonding wire 37 to fourth bonding wire 40 in such a manner that the seal ring 12 passes through the interlayer insulation films 25 to 29. In addition, the contact plug 32, the first element wire 33 to fourth element wire 36, the first bonding wire 37 to fourth bonding wire 40, and the connection wire 41 constitute a desired wire to interconnect the semiconductor element 21 and the bonding pad 13.

The first interlayer insulation film 24 is a flat film formed on the semiconductor layer 22 before a metal wire is formed. The first interlayer insulation film 24 is provided to solve the overall step difference caused during a substrate process. For example, a dopant-doped oxide film, such as borophosphosilicate glass (BPSG), may be used as a material for the first interlayer insulation film 24. The contact plug 32, electrically connected to the semiconductor element 21 formed at the semiconductor layer 22, is formed in the first interlayer insulation film 24. Also, a plug 43 is formed below the seal ring 12. For example, the contact plug 32 and the plug 43 may be formed of tungsten.

The second and fourth interlayer insulation films 25 and 27 respectively have stacked structures in which diffusion prevention films 25a and 27a, low-k films 25b and 27b, which are low dielectric constant films, and cap films 25c and 27c are consecutively stacked. The third interlayer insulation film 26 has a stacked structure in which a diffusion prevention film 26a and a low-k film 26b are consecutively stacked. The fifth to seventh interlayer insulation films 28, 29 and 30 respectively have stacked structure in which diffusion prevention films 28a, 29a and 30a and silicon oxide films 28b, 29b and 30b are consecutively stacked. The eighth interlayer insulation film 31 has a stacked structure in which a diffusion prevention film 31a, a silicon oxide film 31b, and a diffusion prevention film 31c are consecutively stacked. For example, the diffusion prevention films 25a to 31a and 31c may be formed of SiN or SiC. The diffusion prevention films 25a to 31a and 31c function as barrier layers to prevent the diffusion of copper, which is a material to constitute the wires and the seal ring 12. For example, the cap layers 25c and 27c may be formed of SiO2, SiC, SiOC, SiCN, SiN or SiON. The cap layers 25c and 27c function as surface protection films of the low-k films 25b to 27b. For example, the low-k films 25b to 27b may be formed of poly silsesquioxane, containing a methyl group, having a relatively low dielectric constant sufficient to restrain RC delay (methylsilsesquioxane: MSQ), poly silsesquloxane containing hydrogen (hydrogensilsesquioxane: HSQ), a carbon-doped oxide (CDO) film, a polymer film (polyimide, parylene, Teflon (registered trademark), or other copolymers), or an amorphous carbon film. Meanwhile, it is preferable for a material used as the low-k films 25b to 27b to have a dielectric constant of 3.0 or less.

The first element wire 33 and the first bonding wire 37 are formed in the second interlayer insulation film 25. The second element wire 33 and the second bonding wire 38 are formed in the third and fourth interlayer insulation films 26 and 27. The third element wire 35 and the third bonding wire 39 are formed in the fifth and sixth interlayer insulation films 28 and 29. The fourth element wire 36 and the fourth bonding wire 40 are formed in the seventh and eighth interlayer insulation films 30 and 31. The connection wire 41 is formed in the eighth interlayer insulation film 31. Also, the second element wire 34 to the fourth element wire 36 and the second bonding wire 38 to the fourth bonding wire 40 are formed in sectional shapes respectively including via plugs 34a to 36a and 38a to 40a for connection to the corresponding element wires or the corresponding bonding wires formed below the second element wire 34 to the fourth element wire 36 and the second bonding wire 38 to the fourth bonding wire 40 while being adjacent to the second element wire 34 to the fourth element wire 36 and the second bonding wire 38 to the fourth bonding wire 40. Specifically, portions formed in the third, fifth and seventh interlayer insulation films 26, 28 and 30 are the via plugs 34a to 36a and 38a to 40a. These wires are formed of copper having a relatively low electric resistance sufficient to restrain RC delay. Since the copper has a high diffusion coefficient and is easily diffused in silicon or an interlayer insulation film, barrier metal layers 44 to 50 to prevent the diffusion of copper are formed at the surfaces of the respective wires. For example, the barrier metal layers 44 to 50 may be formed of Ta, TaN, W, WN, WSi, Ti, TiN or TiSi.

The seal ring 12 is a combination of respective constituent parts formed in the interlayer insulation films 25 to 29. That is, the seal ring 12 is constituted by a first seal wire 51 formed in the second interlayer insulation film 25, a second seal wire 52 formed in the third and fourth interlayer insulation films 26 and 27, and a third seal wire 53 formed in the fifth and sixth interlayer insulation films 28 and 29, which are stacked and, at the same time, formed as one body in such a manner that the seal wires pass through the interlayer insulation films 25 to 29. Also, the second seal wire 52 and the third seal wire 53 are formed in sectional shapes respectively including seal plugs 52a and 53a for connection to the corresponding seal wires formed below the second seal wire 52 and the third seal wire 53 while being adjacent to the second seal wire 52 and the third seal wire 53. Specifically, portions formed in the third and fifth interlayer insulation films 26 and 28 are the seal plugs 52a and 53a. In the same manner as the multi-layer wires to interconnect the bonding pad 13 and the semiconductor element 21, the seal wires are formed of copper. Therefore, barrier metal layers 55 to 57 to prevent the diffusion of copper into the interlayer insulation films are also formed at the surfaces of the respective seal wires. For example, the barrier metal layers 55 to 57 may be also formed of Ta, TaN, W, WN, WSi, Ti, TiN or TiSi.

FIG. 3 is a sectional view taken along line 3-3 of FIG. 1. The sectional view shown in FIG. 3 includes the bonding pad 13' different from the bonding pad 13, as can be seen from FIG. 1. However, the bonding pad 13 and the bonding pad 13' are different from each other only in that the bonding pad 13 and the bonding pad 13' have different patterns of the wires before the wires are connected to the active region. Therefore, the bonding pad 13 is basically identical in structure to the bonding pad 13'. Hereinafter, different constituent parts will be described with reference to FIG. 3. In addition, parts having structures different from those of FIG. 2 will be described while being denoted by different reference numerals. Parts having structures equivalent to (corresponding to) those of FIG. 2 will be denoted by the same reference numerals with an apostrophe to make a distinction between FIG. 3 and FIG. 2, and a detailed description thereof will be omitted. Also, interlayer insulation films 24 to 31 and wire seals 52 and 51 are the same, and therefore, the interlayer insulation films 24 to 31 and the wire seals 52 and 51 will be denoted by the same reference numerals.

As shown in FIG. 3, a third seal wire 53, which passes through the fifth and sixth interlayer insulation films 28 and 29, is not formed, and a connection wire 59 to interconnect a third element wire 35' and a third bonding wire 39' is formed in the sixth interlayer insulation film 29. A barrier metal layer 60 is formed at the surfaces of the third element wire 35', the third bonding wire 39', and the connection wire 59.

Also, a fourth element wire 36' and a fourth bonding wire 40' are not connected to each other in the eighth interlayer insulation film 31, and a fourth seal wire 54 is formed between the fourth element wire 36' and the fourth bonding wire 40'. Also, the fourth seal wire 54 is formed of copper in the same manner as the other seal wires, and a barrier metal layer 58 to prevent the diffusion of copper is also formed at the surface of the fourth seal wire 54. For example, the barrier metal layer 58 may also be formed of Ta, TaN, W, WN, WSi, Ti, TiN or TiSi. A barrier metal layer 61 is formed at the surface of the fourth bonding wire 40'.

Also, as can be seen from FIGS. 2 and 3, the bonding pads 13 and 13' are not formed in the same layer (i.e., wire layer 23) as the seal ring 12. That is, the interface of the upper end of the seal ring (for example, the upper end face of the fourth seal wire 54 in FIG. 3) is formed at a lower position than the interfaces of the lower ends of the bonding pads 13 and 13' (for example, the lower end faces of the contact plugs 42 and 42'). According to this structure, it is possible to prevent the connection wire from contacting the seal ring 12 at the time of bonding, and it is possible to reduce connection deterioration due to the bonding. Meanwhile, the interface of the upper end of the seal ring 12 may be formed at a higher position than the interfaces of the lower ends of the bonding pads 13 and 13' considering the design of the semiconductor device 10.

As can be seen from FIGS. 2 and 3, the bonding pads 13 and 13' have connection wires in different interlayer insulation films. Consequently, a plurality of openings, through which the connection wires pass, are formed in the seal ring 12 at different positions in the stacking direction (i.e., the height direction). The structures of the openings of the seal ring 12 will be described hereinafter with reference to FIGS. 4A to 4C and 5.

FIGS. 4A to 4C are plan views, in section, respectively illustrating the fourth, sixth and eighth interlayer insulation films 27, 29 and 31 in the broken-line region 4 of FIG. 1. In the fourth interlayer insulation film 27, as shown in FIG. 4A, the bonding wires 38 and 38' formed below the bonding pads 13 and 13' do not have connection wires for connection to the semiconductor elements 21 and 21' in the active region 11, but the bonding wires 38 and 38' are separated from the semiconductor elements 21 and 21' by the seal wire 52.

In the sixth interlayer insulation film 29, as shown in FIG. 4B, the bonding wire 39' is connected to the connection wire 59 and to the semiconductor element 21' of the active region 11. An opening 71 is formed in the seal wire 53, and the connection wire 59 passes through the opening 71. No connection wire is connected to the bonding wire 39, and the bonding wire 39 is separated from the semiconductor element 21 by the seal wire 53.

In the eighth interlayer insulation film 31, as shown in FIG. 4C, the bonding wire 40 is connected to the connection wire 41 and to the semiconductor element 21 of the active region 11. An opening 72 is formed in the seal wire 54, and the connection wire 41 passes through the opening 72. No connection wire is connected to the bonding wire 40', and the bonding wire 40' is separated from the semiconductor element 21' by the seal wire 54. As a result, the bonding wire 40' is connected to the semiconductor element 21' via the bonding wire 39' and the connection wire 59.

FIG. 5 is a sectional view of the region surrounded by the broken-line region 4 of FIG. 1 in the stacking direction of the seal ring 12. As shown in FIG. 5, the seal ring 12 is formed such that the seal ring 12 passes through the interlayer insulation films 25 to 31 between the first interlayer insulation film 24 and the diffusion prevention film 31c. Also, approximately rectangular openings 71 and 72 are formed in the sealing ring 12. Also, the openings 71 and 72 are located at different heights in the stacking direction of the interlayer insulation films. Such location of the openings 71 and 72 prevents the wires from contacting the respective bonding pads. Consequently, it is possible to variously design wires. The connection wires 41 and 59 do not contact the openings 71 and 72, respectively, with the result that the diffusion prevention films 28a to 31a and the silicon oxide films 28b to 31b pass through the openings 71 and 72. It is preferable for the openings 71 and 72 to be formed in the interlayer insulation films including the silicon oxide films. If the openings 71 and 72 are formed in the interlayer insulation films including the low-k films, the low-k films may pass through the openings, and impurities such as moisture may be permeated due to such separation or breakage. Also, even when no separation or breakage occurs, moisture may be permeated due to permeability of the low-k films.

Hereinafter, a method of manufacturing the semiconductor device 10 with the above-stated construction will be described with reference to manufacturing process views shown in FIGS. 6A to 6E. Since the active region 11 has the same element wires as the bonding wires, the active region 11 is omitted from the drawings.

First, a semiconductor element (not shown), which is a circuit element such as a transistor, is formed in an active region of a semiconductor layer 22 (wafer) through a known semiconductor element forming process. Subsequently, a BPSG film, for example, is deposited on the wafer in which the circuit element is formed, and reflow planarization is performed in an $N_2$ atmosphere of approximately 850° C. to form a first interlayer insulation film 24. Afterwards, an opening, which is necessary to form a contact plug (not shown) and a plug 43, is formed in the planarized BPSG film. Subsequently, tungsten is deposited by a chemical vapor deposition (CVD) method using $WF_6$ and $H_2$ as reaction gases, such that the opening is filled with the tungsten, to form a contact plug and a plug 43. Afterwards, the remainder of the tungsten deposited on the first interlayer insulation film 24 is removed, and the first interlayer insulation film 24 is planarized, by a chemical mechanical polishing (CMP) method (FIG. 6A).

Subsequently, a second interlayer insulation film 25 is formed on the first interlayer insulation film 24. First, a SiN film having a thickness of approximately 5 to 200 nm is deposited on the first interlayer insulation film 24 by a plasma CVD method to form a diffusion prevention film 25a. The diffusion prevention film 25a prevents copper constituting wires and a seal ring from being diffused into the first interlayer insulation film 24. Subsequently, a low-k film 25b having a thickness of approximately 100 to 5000 nm is formed on the diffusion prevention film 25a. For example, poly silsesquioxane containing a methyl group (MSQ) may be used as a material for the low-k film, and the low-k film may be formed by a spin on dielectrics (SOD) method in which a solution is spin-coated, and heat treatment is carried out to form a thin film. Meanwhile, the low-k film may be formed by a CVD method in addition to the application method. Also, after the low-k film 25b is formed, helium plasma is irradiated to the surface of the low-k film 25b to perform surface modification. As a result, an adhesive property with a cap film 25c, which will be formed on the low-k film 25b, is improved, and therefore, occurrence of interface separation is difficult. Subsequently, a $SiO_2$ film having a thickness of approximately 5 to 200 nm is deposited on the low-k film 25b by a CVD method using $SiH_4$ and $O_2$ as reaction gases to form a cap film 25c. The cap film 25c functions as a surface protection film of the low-k film 25b, and, at the same time, functions as a hard mask when etching, which will be described later, is carried out on the low-k film. As a result, the diffusion prevention film 25a, the low-k film 25b, the cap film 25c, and the second interlayer insulation film 25 are formed. Subsequently, a mask having openings formed at positions where a first bonding wire 37 and a first seal wire 51 will be formed is formed on the cap film 25c. The cap film 25c, the low-k film 25b, and the diffusion prevention film 25a are etched using an anisotropic dry etching method to form wire grooves 81 and 82 in which a first bonding wire 37 and a first seal wire 51 will be formed by a damascene method (FIG. 6B). Meanwhile, although not shown in the drawing, wire grooves for first element wires 33 and 33' are also simultaneously formed in the same process as the above.

Subsequently, a TiN film having a film thickness of 2 to 50 nm is deposited on the bottoms and sides of the wire grooves 81 and 82 formed in the previous process by a sputtering method to form barrier metal layers 48, 48' and 55. The barrier metal layers 48, 48' and 55 prevent the diffusion of copper, which is a material for the first bonding wires 37 and 37' and the first seal wire 51. Meanwhile, the barrier metal layers 48, 48' and 55 may be formed by a CVD method using $TiCl_4$ and $NH_3$ as reaction gases. Subsequently, a copper film is deposited by an electric field plating method, such that the wire grooves 81 and 82 are filled with the copper film, to form first bonding wires 37 and 37' and a first seal wire 51. Meanwhile, before copper plating is carried out, copper may be deposited in the wire grooves 81 and 82, in which the barrier metal layers 48, 48' and 55 are formed, by a sputtering method to form a plating seed layer. Subsequently, annealing is carried out in an $N_2$ atmosphere of 250° C., for example. Afterwards, the copper deposited on the cap film 25c is removed by a CMP method, and, at the same time, surface planarization is carried out. In the copper removal process, it is preferable to set a polishing pressure to 2.5 to 4.5 psi and to set a relative speed between a polishing pad and a wafer to 60 to 80 m/min as polishing conditions that are capable of securing and wafer surface uniformity at a high polishing rate and a polishing rate. As a result, the first bonding wires 37 and 37' and the first seal wire 51 are formed in the wire grooves 81 and 82 by a damascene method (FIG. 6C). Meanwhile, although not shown in the drawing, first element wires 33 and 33' and barrier metal layers 44 and 44' to protect the first element wires 33 and 33' are also simultaneously formed in the same process as the above.

Also, in the above-described wire groove forming process, the wire groove 81 may be formed in the shape of a lattice, and, in the copper deposition process, copper may be deposited in the lattice-shaped wire groove 81 to form the first bonding wires 37 and 37' in the shape of a lattice. When the first bonding wires 37 and 37' are formed in the shape of a lattice, it is possible to achieve subsequent polishing planarization with higher precision. Consequently, other bonding wires, which will be described later, may be formed in the shape of the same lattice as the above.

Subsequently, a third interlayer insulation film 26 and a fourth interlayer insulation film 27 are consecutively formed on the wafer where the first bonding wires 37 and 37' and the first seal wire 51 are formed. The third interlayer insulation film 26 includes a diffusion prevention film 26a and a low-k film 26b. The fourth interlayer insulation film 27 includes a diffusion prevention film 27a, a low-k film 27b, and a cap film 27c. The diffusion prevention films 26a and 27a, the low-k films 26b and 27b, and the cap film 27c, constituting the third and fourth interlayer insulation films 26 and 27, are formed by the same method as the second interlayer insulation film. After the third and fourth interlayer insulation films 26 and 27 are formed, a mask having openings formed at positions where via plugs 38a and 38a' and a seal plug 51a will be formed is formed on the cap film 27c. The third and fourth interlayer insulation films 26 and 27 are etched by an anisotropic dry etching method to form wire grooves 83 and 84 in which via plugs 38a and 38a' and a seal plug 51a will be formed (FIG. 6D). It is preferable for the wire grooves 83 and 84 to have the same dimensions. Meanwhile, although not shown in the drawing, wire grooves for via plugs of second element wires 34 and 34' are also simultaneously formed in the same process as the above.

Subsequently, a mask having openings formed at positions where second bonding wires 38 and 38' and a second seal wire 52 will be formed is formed on the cap film 27c. The fourth interlayer insulation film 27 is etched by an anisotropic dry etching method to form wire grooves 85 and 86 in which second bonding wires 38 and 38' and a second seal wire 52 will be formed (FIG. 6E). Meanwhile, although not shown in the drawing, wire grooves for second element wires 34 and 34' are also simultaneously formed in the same process as the above.

Subsequently, a TiN film is deposited on the bottoms and sides of the wire grooves 83 to 86 formed in the third and fourth interlayer insulation films 26 and 27 in the above process by a sputtering method to form barrier metal layers 49, 49' and 56. Subsequently, a copper film is deposited by an electric field plating method, such that the wire grooves 83 to 86 are filled with the copper film, to form first bonding wires 38 and 38' including via plugs 38a and 38a' and, at the same time, a second seal wire 52 including a seal plug 52a. That is, the first bonding wires 38 and 38' and the second seal wire 52 are formed by a dual damascene method to form wires including via parts once for all. After the copper film is formed, annealing is carried out in an $N_2$ atmosphere of 250° C., for example. Afterwards, the copper deposited on the cap film 27c is removed by a CMP method, and, at the same time, surface planarization is carried out (FIG. 7F). Meanwhile, although not shown in the drawing, second element wires 34 and 34' are also simultaneously formed in the same process as the above.

Subsequently, fifth and sixth interlayer insulation films 28 and 29 are consecutively formed on the wafer upon which the above process has been carried out. The fifth and sixth interlayer insulation films 28 and 29 respectively include diffusion prevention films 28a and 29a and silicon oxide films 28b and 29b. The diffusion prevention films 28a and 29a constituting the fifth and sixth interlayer insulation films 28 and 29 are formed by the same method as the second interlayer insulation film. The silicon oxide films 28b and 29b are formed by a CVD method using $SiH_4$ and $O_2$ as reaction gases. The silicon oxide films 28b and 29b may have a thickness of approximately 100 to 5000 nm. Subsequently, wire grooves 87 and 88, in which a third bonding wire 39 and a seal wire 35 will be formed, are formed in the fifth and sixth interlayer insulation films 28 and 29 (FIG. 7G1). On the other hand, an opening 71 is formed without partially forming the seal wire 35, and a wire groove 89, in which a third bonding wire 39' and a connection wire 59 will be formed, is formed in a portion forming the connection wire 59 passing through the opening 71 (FIG. 7G2). These wire grooves are formed by the same method as the wire grooves formed in the third and fourth interlayer insulation films 26 and 27. Meanwhile, although not shown in the drawing, wire grooves for third element wires 35 and 35' are also simultaneously formed in the same process as the above.

Subsequently, a TiN film is deposited on the bottoms and sides of the wire grooves 87 to 89 formed in the fifth and sixth interlayer insulation films 28 and 29 in the above process by a sputtering method to form barrier metal layers 50, 50' and 60. Subsequently, a copper film is deposited by an electric field plating method, such that the wire grooves 87 and 88 are filled with the copper film, to form a third bonding wire 39 and a third seal wire 53 (FIG. 7H1). On the other hand, a third bonding wire 39' and a connection wire 59 are formed, while being connected to each other, in a portion where an opening 71 is formed without forming the third seal wire 53 by an electric field plating method (FIG. 7H2). Consequently, the third bonding wires 39 and 39' and the third seal wire 53 are formed by a dual damascene method to simultaneously form even via parts. After the copper film is formed, annealing is carried out in an $N_2$ atmosphere of 250° C., for example. Afterwards, the copper deposited on the cap film 25c is removed by a CMP method, and, at the same time, surface planarization is carried out. Meanwhile, although not shown in the drawing, third element wires 35 and 35' are also simultaneously formed in the same process as the above.

Subsequently, part of a seventh interlayer insulation film 30 and part of an eighth interlayer insulation film 31 are consecutively formed on the wafer to which the above process has been carried out. The seventh interlayer insulation film 30 includes a diffusion prevention film 30a and a silicon oxide film 30b. The eighth interlayer insulation film 31 includes a diffusion prevention film 31a, a silicon oxide film 31b, and a diffusion prevention film 31c. Hereinafter, it will be described that only the diffusion prevention film 31a and the silicon oxide film 31b of the eighth interlayer insulation film 31 are formed. The diffusion prevention films 30a and 31a constituting the seventh and eighth interlayer insulation films 30 and 31 are formed by the same method as the second interlayer insulation film. The silicon oxide films 30b and 31b are formed by the same method as the fifth interlayer insulation film 28. Subsequently, an opening 72 is formed in the seventh and eighth interlayer insulation films 30 and 31 without partially forming a seal wire 54, and a wire groove, in which a fourth bonding wire 40 and a connection wire 41 will be formed, is formed in a portion forming the connection wire 41 passing through the opening 72. In order to separate a fourth bonding wire 40' from a fourth element wire 36' by the seal wire 54, on the other hand, wire grooves, in which the seal wire 54 and the fourth bonding wire 40' will be formed, are formed. These wire grooves are formed by the same method as the wire grooves formed in the third and fourth interlayer insulation films 26 and 27. Subsequently, a TiN film is deposited on the bottoms and sides of the wire grooves formed in the seventh and eighth interlayer insulation films 30 and 31 in the above process by a sputtering method to form barrier metal layers 47, 58 and 61. Subsequently, a copper film is deposited by an electric field plating method, such that the wire grooves are filled with the copper film, to form a fourth bonding wire 40 and a fourth seal wire 41 while being connected to each other (FIG. 8I1). On the other hand, the fourth bonding wire 40' and the fourth seal wire 54 are formed in a portion where the fourth bonding wire 40' is separated from the fourth element wire 36' by the seal wire 54 by an electric field plating method (FIG. 8I2). Consequently, the fourth bonding wires 40 and 40' and the fourth seal wire 54 are formed by a dual damascene method to simultaneously form even via parts. After the copper film is formed, annealing is carried out in an $N_2$ atmosphere of 250° C., for example. Afterwards, the copper deposited on the cap film 25c is removed by a CMP method, and, at the same time, surface planarization is carried out. Meanwhile, although not shown in the drawing, fourth element wires 36 and 36' are also simultaneously formed in the same process as above.

Subsequently, a diffusion prevention film 31c is formed on the silicon oxide film 30b to complete an eighth interlayer insulation film 31. The diffusion prevention film 31c is formed by the same method as the second interlayer insulation film. Subsequently, openings, in which contact plugs 42 and 42' will be formed, are formed, and tungsten is deposited by a CVD method using $WF_6$ and $H_2$ as reaction gases, such that the openings are filled with the tungsten, to form contact plugs 42 and 42'. Afterwards, bonding pads 13 and 13', which are desired external connection terminals, are formed to complete a semiconductor device 10 according to the embodiment of the present invention (FIGS. 8J1 and 8J2).

Although, in this embodiment, the seal ring and multi-layer wires are formed simultaneously with the seal plugs, the seal wires, the via plugs, and the circuit wires by a dual damascene method, it is also possible to use a single damascene method. That is, in this case, the seal plugs and via plugs are formed in the interlayer insulation films, the upper-layer interlayer insulation film is formed, and only the seal wires and the circuit wires are formed by a damascene method.

As apparent from the above description, the semiconductor device 10 according to this embodiment has the following effects. The seal ring 12, which is a cylindrical water-proof ring, having the openings 71 and 72 for allowing the wires interconnecting the semiconductor elements 21 and 21' and the bonding pads 13 and 13', which are the external connection terminals, to pass therethrough, extends in the insulation layers provided on the semiconductor layer 22 including the semiconductor elements 21 and 21' to surround the entirety of the semiconductor elements 21 and 21', whereby it is possible to prevent impurities such as moisture from being introduced into the active region 11 at the time of dicing and at the time of bonding and to easily achieve miniaturization of the semiconductor device 10.

Although the exemplary embodiment of the present invention has been disclosed for illustrative purposes, those skilled in the art will appreciate that various modifications, additions and substitutions are possible, without departing from the scope and spirit of the invention as disclosed in the accompanying claims.

BRIEF DESCRIPTION OF THE DRAWINGS

The above and other objects, features and other advantages of the present invention will be more clearly understood from the following detailed description taken in conjunction with the accompanying drawings, in which:

FIGS. 7F to 7H2 are sectional views illustrating respective processes for manufacturing the semiconductor device according to the embodiment of the present invention; and FIGS. 8I1 to 8J2 are sectional views illustrating respective processes for manufacturing the semiconductor device according to the embodiment of the present invention.

EXPLANATION OF SIGNS

Figure 1:
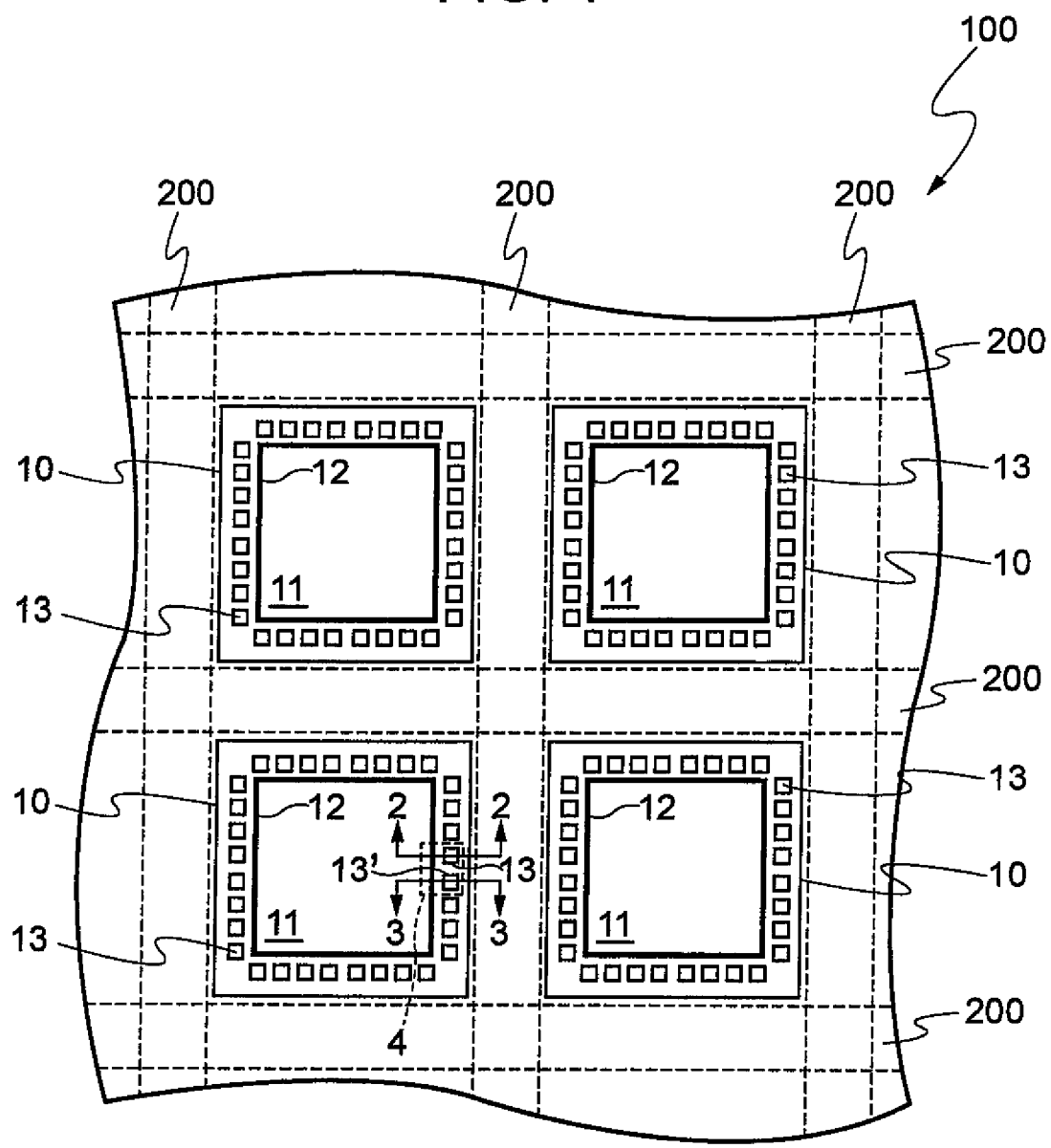
FIG. 1 is a plan view illustrating part of a wafer having a semiconductor device according to an embodiment of the present invention formed thereon.
Figure 2:
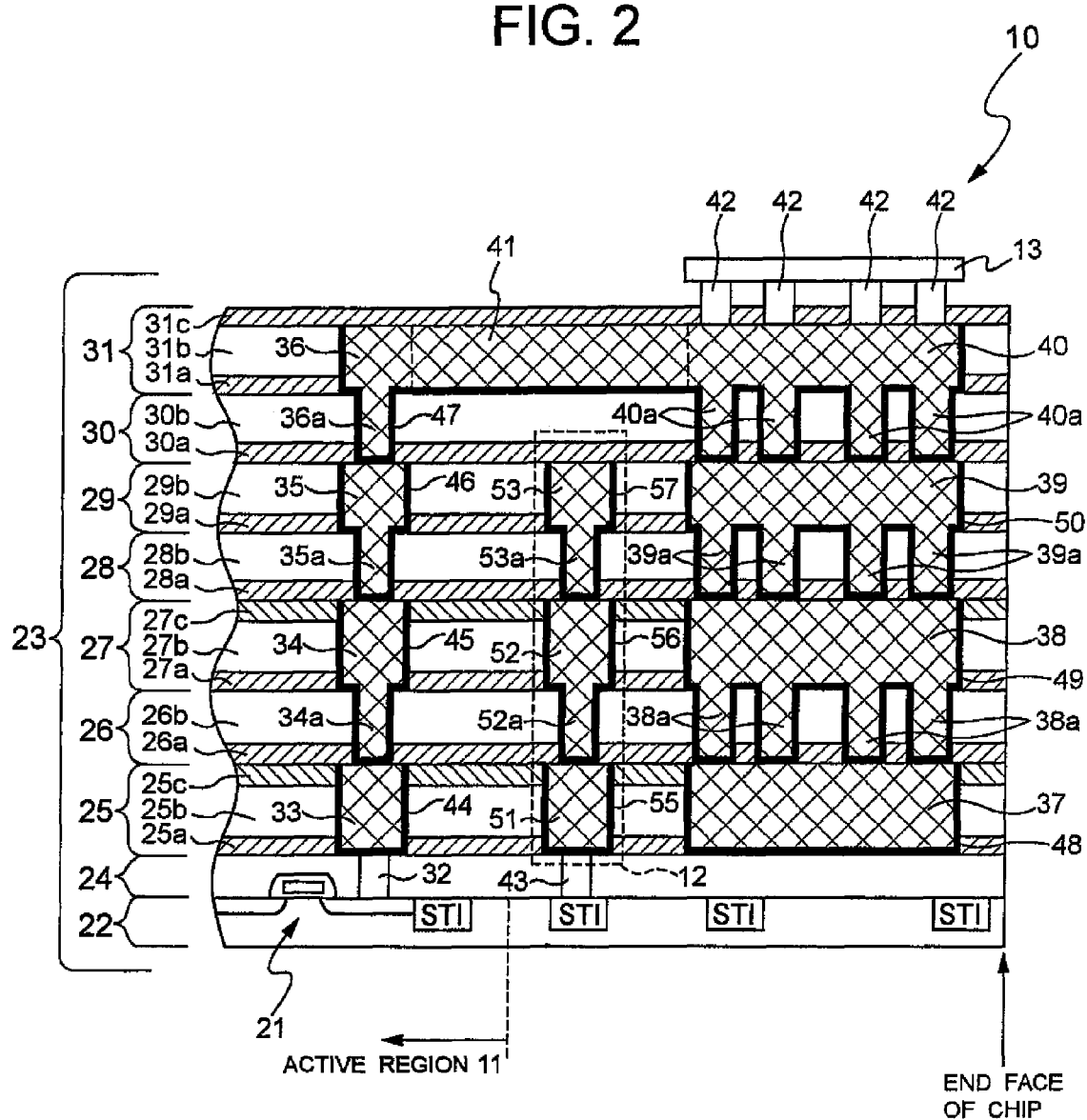
FIG. 2 is a sectional view taken along line 2-2 of FIG. 1.
Figure 3:
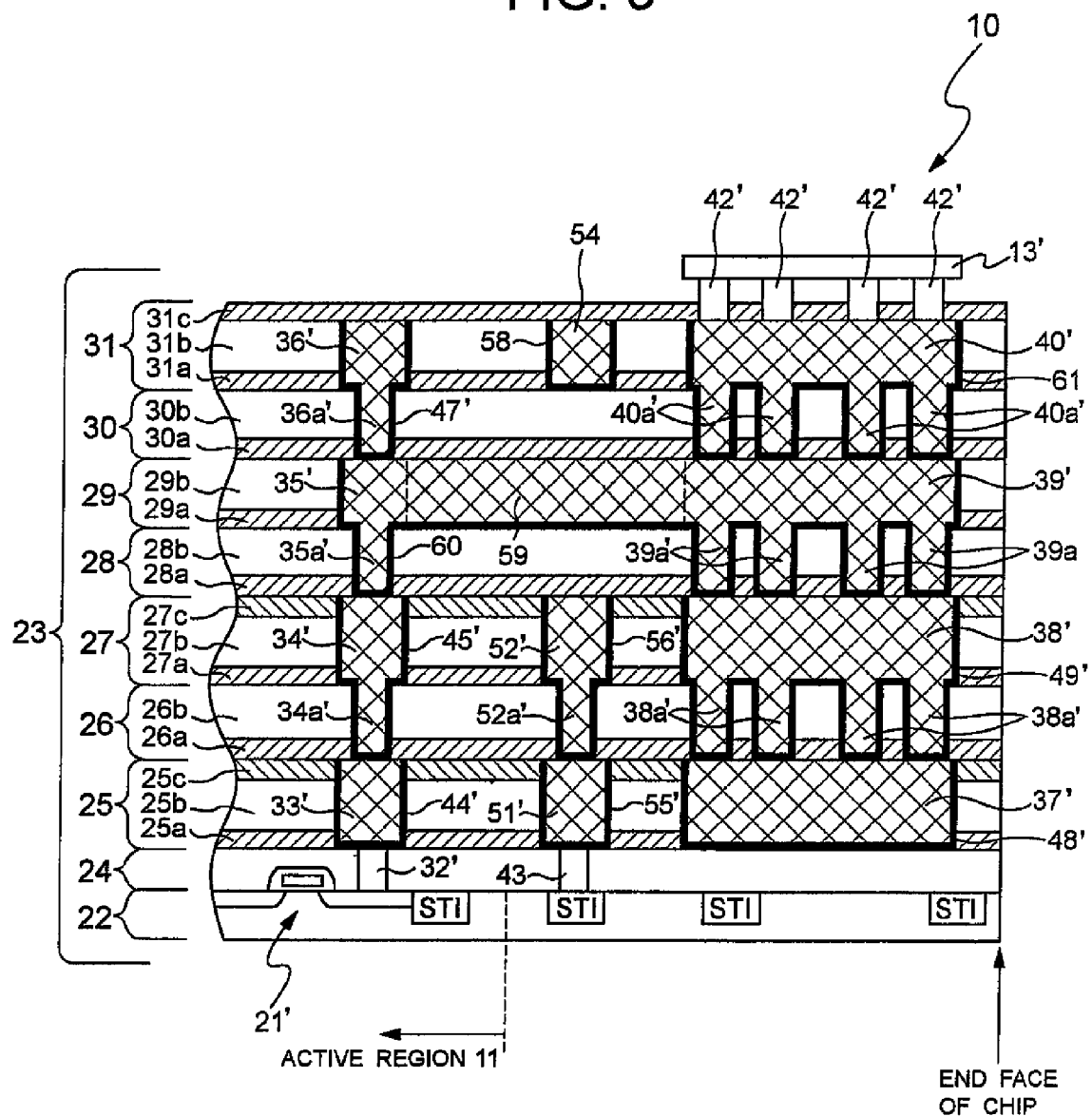
FIG. 3 is a sectional view taken along line 3-3 of FIG. 1.
Figure 4:
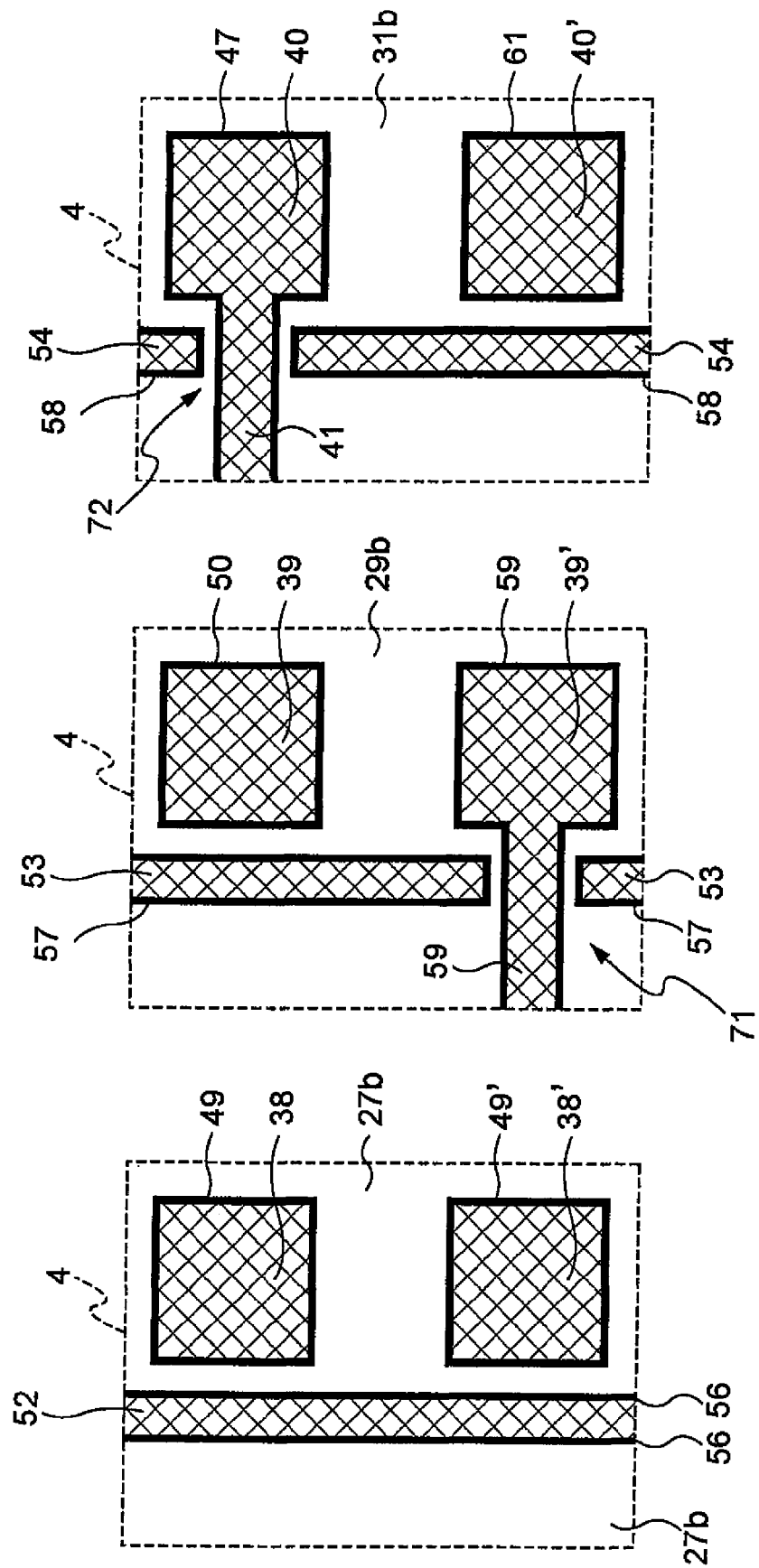
FIGS. 4A to 4C are plan views, in section, illustrating a region surrounded by a broken-line region 4 of FIG. 1 at respective interlayer insulation films.
Figure 5:
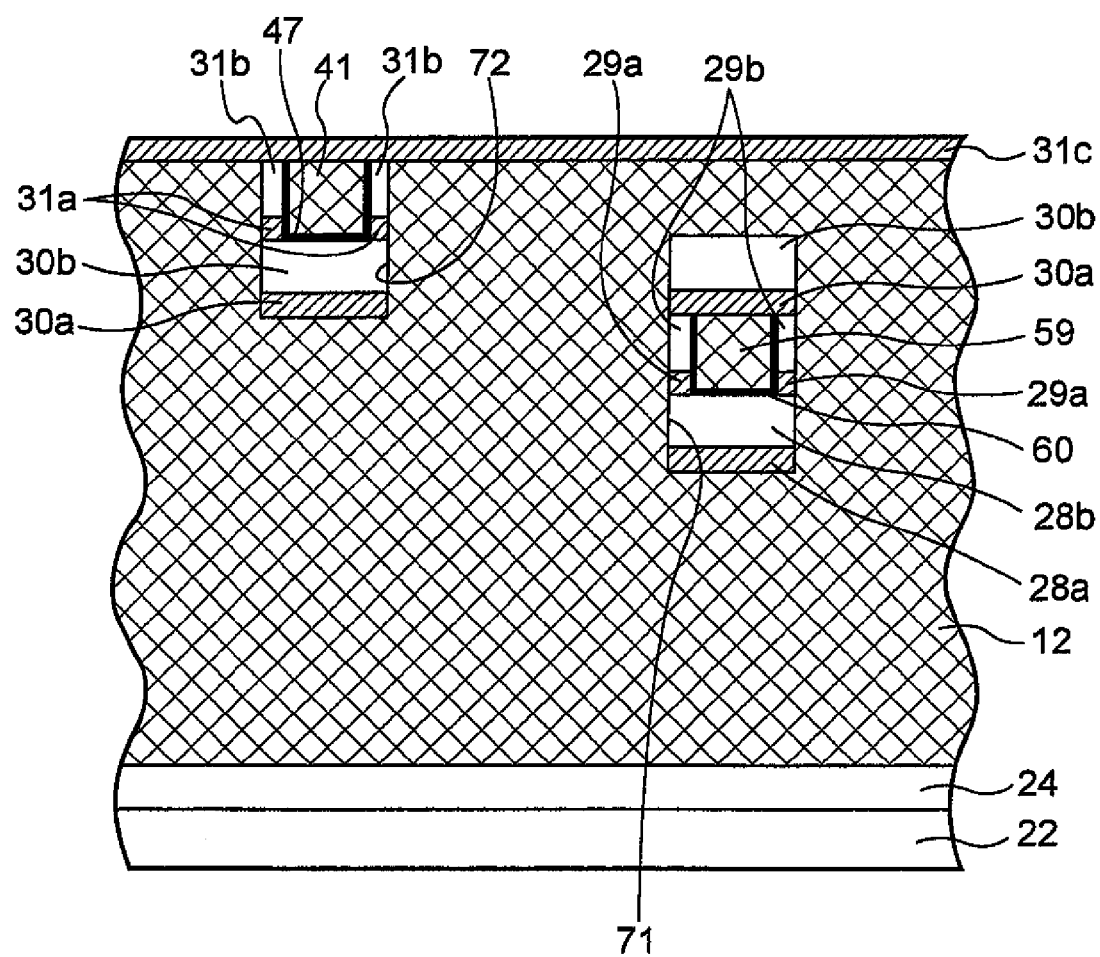
FIG. 5 is a sectional view of the region surrounded by the broken-line region 4 of FIG. 1 in the seal ring stacking direction.
Figure 6A:
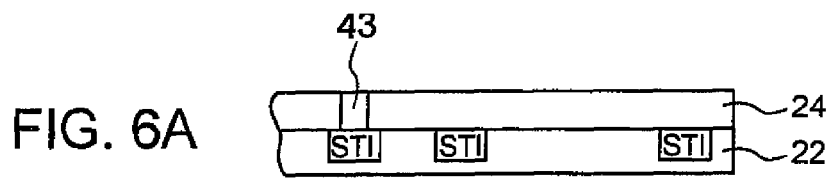
FIGS. 6A to 6E are sectional views illustrating respective processes for manufacturing the semiconductor device according to the embodiment of the present invention.
Figure 6B:
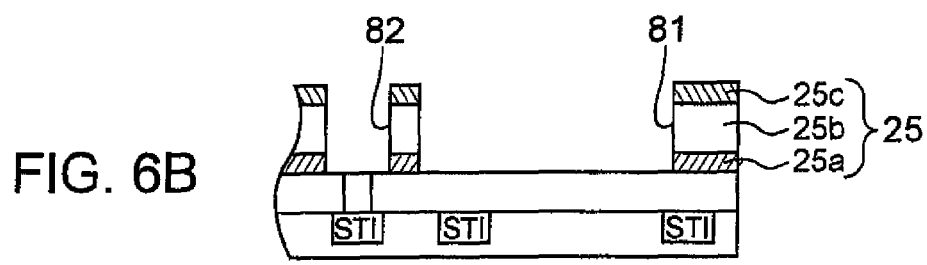
Figure 6C:
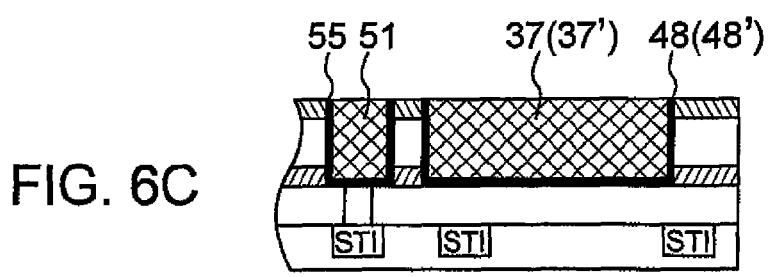
Figure 6D:
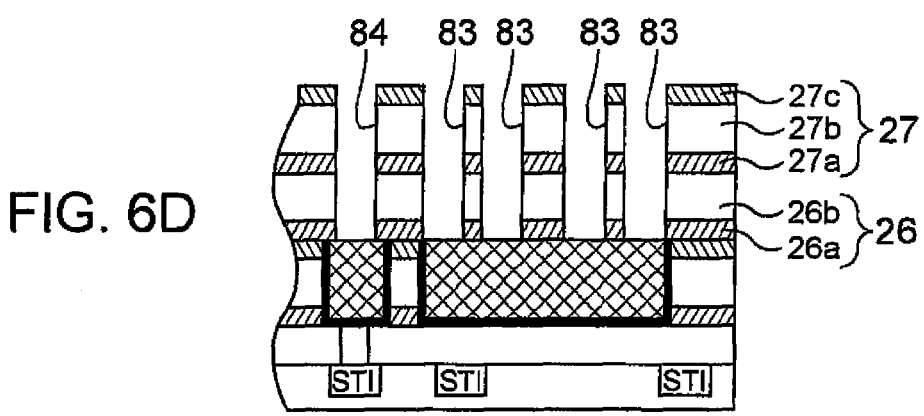
Figure 6E:
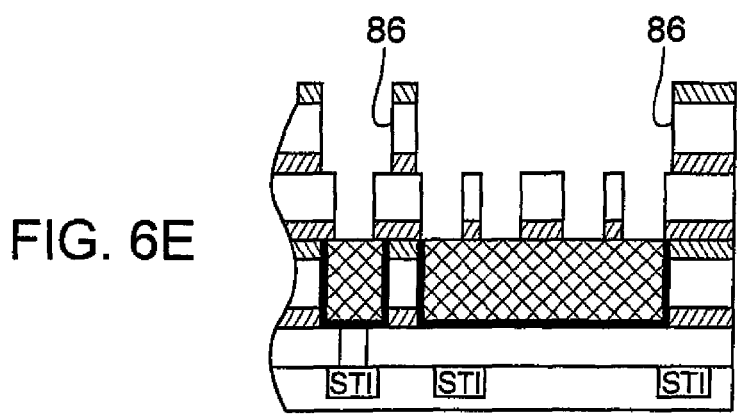

10 semiconductor device
12 seal ring
13 bonding pad
22 semiconductor layer
23 wiring layer
24-31 interlayer insulation film
51 first seal wiring
52 second seal wiring
53 third seal wiring
54 fourth seal wiring This application is based on Japanese Patent Application No. 2008-136999 which is hereby incorporated by reference.

What is claimed is:

1. A semiconductor device comprising:
   a semiconductor layer having a plurality of semiconductor elements;
   an insulation film provided on the semiconductor layer, said insulation film having a laminated structure;
   external connection terminals provided on the insulation film outside a region where the plurality of semiconductor elements are formed;
   wires passing through the insulation film to interconnect the external connection terminals and the semiconductor elements respectively; and
   a cylindrical dummy wire which includes openings through which the wires pass respectively, which extends in the insulation film to surround all the semiconductor elements, and which is disposed between the external connection terminals and the region where the plurality of semiconductor elements are formed,
   wherein the openings are formed in the cylindrical dummy wire at different heights along a laminating direction of said insulation film.

2. The semiconductor device according to claim 1, wherein the insulation film having the laminated structure comprises low dielectric constant films and silicon oxide films.

3. The semiconductor device according to claim 2, wherein the low dielectric constant films have a relative dielectric constant of 3 or less.

4. The semiconductor device according to claim 1, wherein the cylindrical dummy wire is formed of copper.

5. The semiconductor device according to claim 1, wherein the cylindrical dummy wire has an upper-end interface below a lower-end interface of the external connection terminals.

6. The semiconductor device according to claim 2, wherein layers constituted by the low dielectric constant films are located below layers constituted by the silicon oxide films.

7. The semiconductor device according to claim 2, wherein the openings are formed in portions of the cylindrical dummy wire each extending in each of the silicon oxide films.

* * * * *